United States Patent

Kim

(10) Patent No.: US 7,474,588 B2
(45) Date of Patent: Jan. 6, 2009

(54) DATA OUTPUT CIRCUITS FOR AN INTEGRATED CIRCUIT MEMORY DEVICE IN WHICH DATA IS OUTPUT RESPONSIVE TO SELECTIVE INVOCATION OF A PLURALITY OF CLOCK SIGNALS, AND METHODS OF OPERATING THE SAME

(75) Inventor: Sung-Ryul Kim, Kyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 61 days.

(21) Appl. No.: 11/755,165

(22) Filed: May 30, 2007

(65) Prior Publication Data

US 2007/0291553 A1   Dec. 20, 2007

(30) Foreign Application Priority Data

Jun. 9, 2006   (KR) ............... 10-2006-0051985

(51) Int. Cl.
*G11C 8/18* (2006.01)

(52) U.S. Cl. ............... 365/233.11; 365/189.05; 365/189.02

(58) Field of Classification Search ............ 365/233.11, 365/189.05, 189.02

See application file for complete search history.

(56) References Cited

U.S. PATENT DOCUMENTS

| 4,947,379 | A | | 8/1990 | Okuyama |
| 5,390,149 | A | * | 2/1995 | Vogley et al. .......... 365/189.14 |
| 5,426,606 | A | | 6/1995 | Takai |
| RE35,934 | E | | 10/1998 | Takai |
| 7,139,862 | B2 | * | 11/2006 | Hemming ............ 711/5 |

FOREIGN PATENT DOCUMENTS

| KR | 91-009439 B1 | 11/1991 |
| KR | 0160360 B1 | 2/1999 |

* cited by examiner

*Primary Examiner*—Huan Hoang
(74) *Attorney, Agent, or Firm*—Myers Bigel Sibley & Sajovec, P.A.

(57) ABSTRACT

A data output circuit for an integrated circuit memory device includes a control circuit that is configured to generate a plurality of clock signals responsive to at least a portion of a memory column address, and a multiplexer circuit that is configured to output memory data received on input terminals thereof onto an output terminal responsive to selective invocation of the plurality of clock signals. The clock signals are invoked in an order based on the at least a portion of the memory column address.

28 Claims, 10 Drawing Sheets

FIG. 4

| BURST LENGTH | CA | SEQUENTIAL MODE | INTERLEAVE MODE |
|---|---|---|---|
| 4 | 00 | 0, 1, 2, 3 | 0, 1, 2, 3 |
|   | 01 | 1, 2, 3, 0 | 1, 0, 3, 2 |
|   | 10 | 2, 3, 0, 1 | 2, 3, 0, 1 |
|   | 11 | 3, 0, 1, 2 | 3, 2, 1, 0 |
| 8 | 000 | 0, 1, 2, 3, 4, 5, 6, 7 | 0, 1, 2, 3, 4, 5, 6, 7 |
|   | 001 | 1, 2, 3, 4, 5, 6, 7, 0 | 1, 0, 3, 2, 5, 4, 7, 6 |
|   | 010 | 2, 3, 4, 5, 6, 7, 0, 1 | 2, 3, 0, 1, 6, 7, 4, 5 |
|   | 011 | 3, 4, 5, 6, 7, 0, 1, 2 | 3, 2, 1, 0, 7, 6, 5, 4 |
|   | 100 | 4, 5, 6, 7, 0, 1, 2, 3 | 4, 5, 6, 7, 0, 1, 2, 3 |
|   | 101 | 5, 6, 7, 0, 1, 2, 3, 4 | 5, 4, 7, 6, 1, 0, 3, 2 |
|   | 110 | 6, 7, 0, 1, 2, 3, 4, 5 | 6, 7, 4, 5, 2, 3, 0, 1 |
|   | 111 | 7, 0, 1, 2, 3, 4, 5, 6 | 7, 6, 5, 4, 3, 2, 1, 0 |

| | | COLUMN ADDRESS | | | |
|---|---|---|---|---|---|
| | | SEQUENTIAL MODE | | INTERLEAVE MODE | |
| | | CA0 | CA1 | CA0 | CA1 |
| CA_W | <0> | 0 | 0 | 0 | 0 |
|      | <1> | 1 | 0 | 1 | 0 |
|      | <2> | 0 | 1 | 0 | 1 |
|      | <3> | 1 | 1 | 1 | 1 |
| CA_X | <0> | 1 | 0 | 1 | 0 |
|      | <1> | 0 | 1 | 0 | 1 |
|      | <2> | 1 | 1 | 1 | 1 |
|      | <3> | 0 | 0 | 0 | 0 |
| CA_Y | <0> | 0 | 1 | 0 | 1 |
|      | <1> | 1 | 1 | 1 | 1 |
|      | <2> | 0 | 0 | 0 | 0 |
|      | <3> | 1 | 0 | 1 | 0 |
| CA_Z | <0> | 1 | 1 | 1 | 1 |
|      | <1> | 0 | 1 | 0 | 1 |
|      | <2> | 1 | 0 | 1 | 0 |
|      | <3> | 0 | 0 | 0 | 0 |

DATA OUTPUT CIRCUITS FOR AN INTEGRATED CIRCUIT MEMORY DEVICE IN WHICH DATA IS OUTPUT RESPONSIVE TO SELECTIVE INVOCATION OF A PLURALITY OF CLOCK SIGNALS, AND METHODS OF OPERATING THE SAME

RELATED APPLICATION

This application claims the benefit of and priority to Korean Patent Application No. 10-2006-0051985, filed Jun. 9, 2006, in the Korean Intellectual Property Office, the disclosure of which is hereby incorporated herein by reference as if set forth in its entirety.

FIELD OF THE INVENTION

The present invention relates generally to integrated circuit devices and methods of operating the same and, more particularly, to integrated circuit memory devices and methods of operating the same.

BACKGROUND OF THE INVENTION

FIG. 1 is a block diagram of a conventional semiconductor memory device 10, such as a dynamic random access memory (DRAM) device that includes a control circuit 20, address buffer 30, row decoders 40, memory cell array 50, sense amplifiers 60, data output circuit 70, and column decoders 80, which are configured as shown. The control circuit 20 is used to control operations of the address buffer 30 and the row decoders 40 responsive to one or more control signals. The address buffer 30 receives an address A0-An AND logic circuit divides the address into a row address and a column address, which are respectively used to drive the row decoders 40 and column decoders 80. The output of the row decoders 40 is used to select particular word lines of the memory cell array 50. The output of the column decoders 80 is used to select particular bits of words stored in the memory cell array 50 via the sense amplifiers 60 and the data control circuit 70. The data output circuit 70 may, for example, output data DQ0-DQ7 corresponding to eight bits from a selected word.

Data may be output through the data output circuit 70 through a burst read operation. The burst length of a burst read operation corresponds to the number bits, bytes, and/or words that are output in one burst read operation. The column address strobe (CAS) latency is the number of clock cycles from the beginning of a rising edge of a clock until the first data are output. FIG. 2 illustrates the data output circuit 70 in more detail. The data output circuit 70 includes an ordering circuit 200 a multiplexer circuit 210, and a pulse generator 220 that are configured as shown. The ordering circuit 200 is coupled to the memory core 230 and receives data (D0, D1, D2, D3) therefrom for output responsive to a read command. The ordering circuit 200 may be implemented as a switching circuit that outputs data onto particular output lines of the ordering circuit based on the column address associated with the read command. In the example shown in FIG. 2, if the column address is 01 and the memory device is operating in sequential mode, then the output order for the data is D1, D2, D3, and D0. Accordingly, the ordering circuit 200 switches data D1 onto the data output line DO0, switches data D2 onto the data output line DO1, switches data D3 onto the data output line DO2, and switches data D0 onto the data output line DO3. The switches CDQ_1, CDQ_2, CDQ_3 and CDQ_4 are closed and opened in order responsive to the CDQ signal output by the pulse generator 220 to output the data D1, D2, D3, and D0 in order onto the output line DOP. Table 1 below illustrates the data output order for burst lengths of 4 and 8 based on starting column address for both a sequential mode of operation and an interleave mode of operation.

TABLE 1

| Burst Length | CA | Sequential | Interleave |
|---|---|---|---|
| 4 | 000 | 0, 1, 2, 3 | 0, 1, 2, 3 |
| 4 | 001 | 1, 2, 3, 0 | 1, 0, 3, 2 |
| 4 | 010 | 2, 3, 0, 1 | 2, 3, 0, 1 |
| 4 | 011 | 3, 0, 1, 2 | 3, 2, 1, 0 |
| 8 | 000 | 0, 1, 2, 3, 4, 5, 6, 7 | 0, 1, 2, 3, 4, 5, 6, 7 |
| 8 | 001 | 1, 2, 3, 4, 5, 6, 7, 0 | 1, 0, 3, 2, 5, 4, 7, 6 |
| 8 | 010 | 2, 3, 4, 5, 6, 7, 0, 1 | 2, 3, 0, 1, 6, 7, 4, 5 |
| 8 | 011 | 3, 4, 5, 6, 7, 0, 1, 2 | 3, 2, 1, 0, 7, 6, 5, 4 |
| 8 | 100 | 4, 5, 6, 7, 0, 1, 2, 3 | 4, 5, 6, 7, 0, 1, 2, 3 |
| 8 | 101 | 5, 6, 7, 0, 1, 2, 3, 4 | 5, 4, 7, 6, 1, 0, 3, 2 |
| 8 | 110 | 6, 7, 0, 1, 2, 3, 4, 5 | 6, 7, 4, 5, 2, 3, 0, 1 |
| 8 | 111 | 7, 0, 1, 2, 3, 4, 5, 6 | 7, 6, 5, 4, 3, 2, 1, 0 |

Unfortunately, the ordering circuit 200 consumes chip area in an integrated circuit memory device and physically switching data read from the memory core onto output lines of the ordering circuit can introduce delay in outputting data.

SUMMARY

According to some embodiments of the present invention, a data output circuit for an integrated circuit memory device includes a control circuit that is configured to generate a plurality of clock signals responsive to at least a portion of a memory column address, and a multiplexer circuit that is configured to output memory data received on input terminals thereof onto an output terminal responsive to selective invocation of the plurality of clock signals. The clock signals are invoked in an order based on the at least a portion of the memory column address.

In other embodiments of the present invention, the memory data comprise N memory data units, and the control circuit comprises an order control signal generator that is configured to generate an order control signal responsive to the at least a portion of a memory column address. The order control signal encodes an output order for the N respective memory data units.

In still other embodiments of the present invention, the control circuit further comprises a reference pulse generator that is configured to generate a periodic pulse trains and a pulse multiplexer circuit that is configured to output N pulse signals from the periodic pulse train that are respectively associated with the N data units responsive to the order control signal such that a timing between the respective pulse signals is based on the output order encoded in the order control signal.

In still other embodiments of the present invention, wherein the plurality of clock signals comprises the N pulse signals.

In still other embodiments of the present invention, the control circuit further comprises a latch circuit that is configured to delay the order control signal responsive to a delay compensation signal.

In still other embodiments of the present invention, the delay compensation signal defines a time period for outputting the N memory data units.

In still other embodiments of the present invention, the reference pulse generator comprises a plurality of flip-flop circuits connected in series.

In still other embodiments of the present invention, the memory data units are bits.

In still other embodiments of the present invention, the memory data units are bytes.

In still other embodiments of the present invention, the integrated circuit memory device is a DRAM memory device.

In still other embodiments of the present invention, the multiplexer circuit is configured to output the memory data in an interleaved order.

In still other embodiments of the present invention, the multiplexer circuit is configured to output the memory data in a sequential order.

In further embodiments of the present invention, an integrated circuit memory device that includes a data output circuit is operated by generating a plurality of clock signals responsive to at least a portion of a memory column address, and multiplexing memory data onto an output terminal of the data output circuit responsive to selective invocation of the plurality of clock signals. The clock signals are invoked in an order based on the at least a portion of the memory column address.

In still further embodiments of the present invention, the memory data comprise N memory data units, and generating the plurality of clock signals comprises generating an order control signal that encodes an output order for the N respective memory data units responsive to the at least a portion of a memory column address.

In still further embodiments of the present invention, generating the plurality of clock signals further comprises generating a periodic pulse train, and selecting N pulse signals from the periodic pulse train that are respectively associated with the N data units responsive to the order control signal such that a timing between the respective pulse signals is based on the output order encoded in the order control signal.

In still further embodiments of the present invention, the plurality of clock signals comprises the N pulse signals.

In still further embodiments of the present invention, generating the plurality of clock signals further comprises delaying the order control signal responsive to a delay compensation signal.

In still further embodiments of the present invention, the delay compensation signal defines a time period for outputting the N memory data units onto the output terminal.

In still further embodiments of the present invention, the memory data units are bits.

In still further embodiments of the present invention, the memory data units are bytes.

In still further embodiments of the present invention, multiplexing the memory data comprises multiplexing memory data onto the output terminal of the data output circuit in an interleaved order.

In still further embodiments of the present invention, multiplexing the memory data comprises multiplexing memory data onto the output terminal of the data output circuit in a sequential order.

In other embodiments of the present invention, a memory device comprises a memory core that is configured to store data therein, a control circuit that is configured to generate a plurality of clock signals responsive to at least a portion of a memory core column address, and a multiplexer circuit that is configured to output the memory core data received on input terminals thereof onto an output terminal responsive to selective invocation of the plurality of clock signals. The clock signals are invoked in an order encoded based on the at least a portion of the memory core column address.

In still other embodiments of the present invention, the memory core data comprise N memory core data units, and the control circuit comprises an order control signal generator that is configured to generate an order control signal responsive to the at least a portion of a memory core column address. The order control signal encodes an output order for the N respective memory core data units.

In still other embodiments of the present invention, the control circuit further comprises a reference pulse generator that is configured to generate a periodic pulse train, and a pulse multiplexer circuit that is configured to output N pulse signals from the periodic pulse train that are respectively associated with the N data units responsive to the order control signal such that a timing between the respective pulse signals is based on the output order encoded in the order control signal.

In still other embodiments of the present invention, the memory device is a DRAM memory device.

In still other embodiments of the present invention, the multiplexer circuit is configured to output the memory core data in an interleaved order.

In still other embodiments of the present invention, the multiplexer circuit is configured to output the memory core data in a sequential order.

BRIEF DESCRIPTION OF THE DRAWINGS

Other features of the present invention will be more readily understood from the following detailed description of specific embodiments thereof when read in conjunction with the accompanying drawings, in which:

FIG. 4 is a logic table for use by the control pulse generator circuit of FIG. 3, in accordance with some embodiments of the present invention;

DETAILED DESCRIPTION OF EMBODIMENTS

Figure 1:
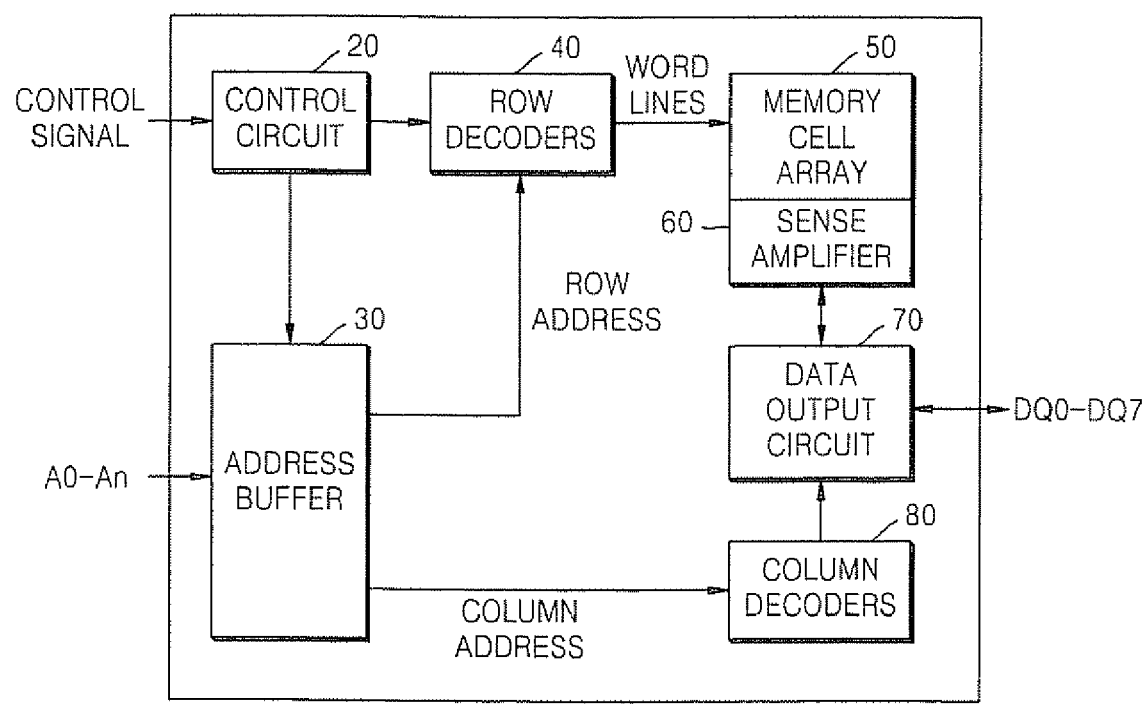
FIG. 1 is a block diagram of a conventional semiconductor memory device, such as a dynamic random access memory (DRAM) device.
Figure 2:
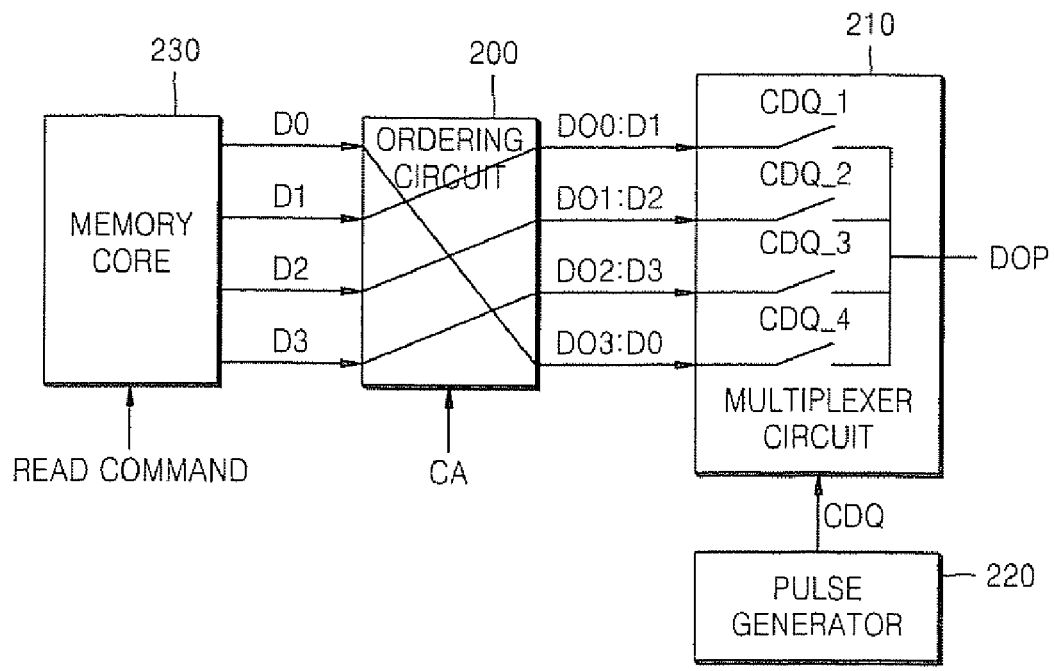
FIG. 2 illustrates the data output circuit of FIG. 1 in more detail.

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be farther understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be farther understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Some embodiments of the present invention may provide memory devices that may reduce delays in outputting data by eliminating the ordering circuit that is used in the data output circuit in some conventional memory devices. By eliminating the ordering circuit, less circuit area may be required for the data output circuit. According to some embodiments of the present invention, data are output from a memory through a multiplexer circuit responsive to the selective invocation of a plurality of clock signals. The clock signals are invoked in an order encoded by an order control signal. In contrast with the physical switching performed by an ordering circuit in conventional memory devices, some embodiments of the present invention output data in a particular order by adjusting the timing of when various data units are output through a multiplexer circuit.

Figure 3:
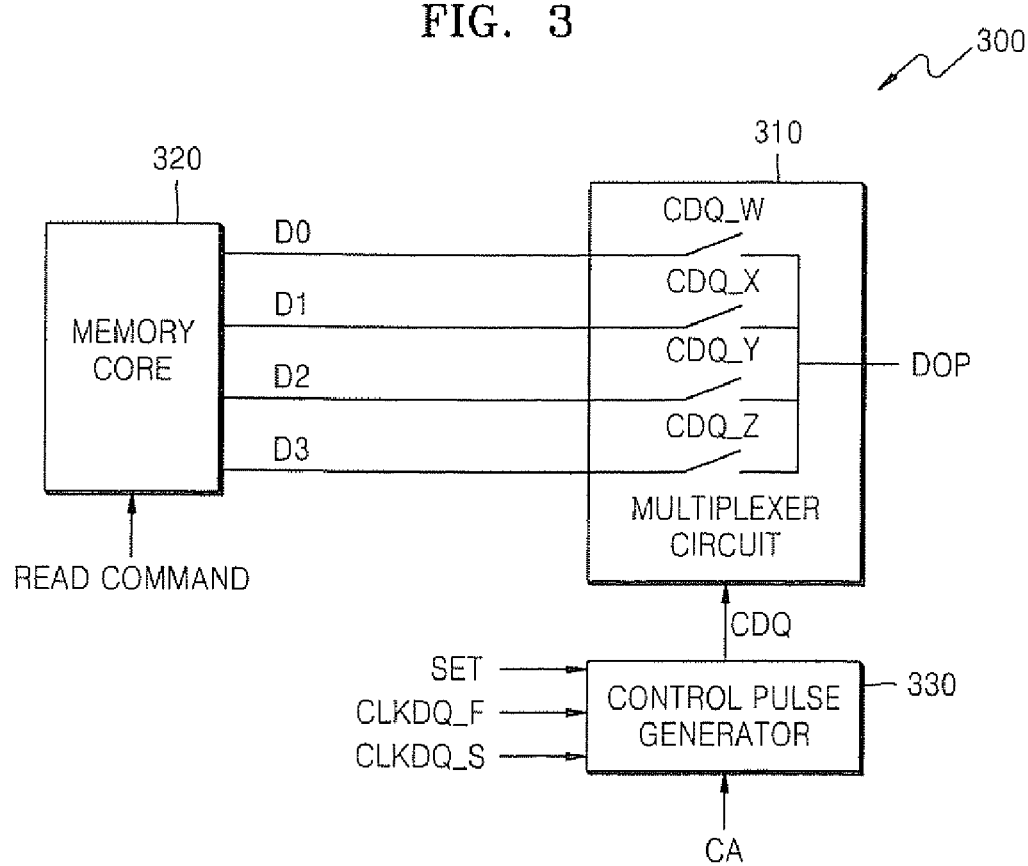
FIG. 3 is a block diagram of a data output circuit for an integrated circuit memory device, according to some embodiments of the present invention.

Referring to FIG. 3, a data output circuit 300 for an integrated circuit memory device, such as a DRAM device, according to some embodiments of the present invention, comprises a multiplexer circuit 310 and a control pulse generator 330 that are configured as shown. The multiplexer circuit 310 is coupled to a memory core 320 and receives data (D0, D1, D2, D3) therefrom for output responsive to a read command. The multiplexer circuit 310 is configured to output memory data received on input terminals thereof responsive to the selective invocation of a plurality of clock signals CDQ, which is generated by the control pulse generator 330 responsive to at least a portion of a column address CA. In accordance with various embodiments of the present invention, the memory data (D0, D1, D2, and D3) may be in units of bits, bytes, or other units.

Figure 5:
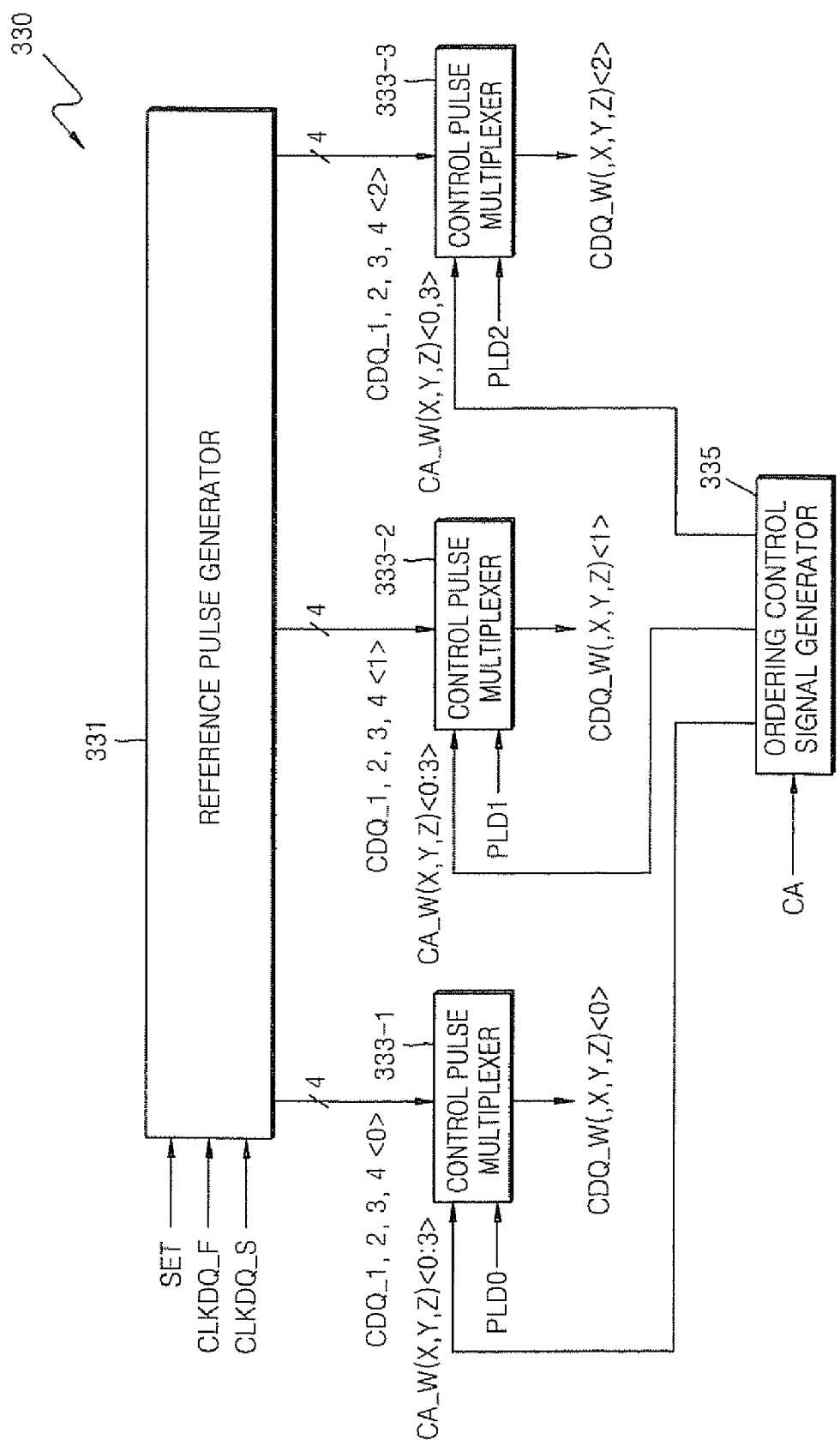
FIG. 5 is a block diagram of the control pulse generator circuit of FIG. 3 in accordance with some embodiments of the present invention.

The control pulse generator 330 will be described in more detail with reference to the logic table of FIG. 4 and the block diagram of FIG. 5. As shown in FIG. 5, the control pulse generator comprises a reference pulse generator 331, a control pulse multiplexer circuit 333-1, 333-2, 333-3, and an ordering control signal generator circuit 335 that are configured as shown. Some embodiments of the present invention are illustrated herein with respect to a burst length of four data units. It will be understood that other burst lengths can be used in accordance with various embodiments of the present invention. The reference pulse generator 331 generates three groups of a periodic pulse train denoted as CDQ_1, 2, 3, 4<0>, CDQ_1, 2, 3, 4<1>, and CDQ_1, 2, 3, 4<2>. Four pulse signals are used for a burst length of four data units. In general N pulse signals can be generated for a burst length of N data units. Three control pulse multiplexer circuits 333-1, 333-2, 333-3 generate the plurality of clock signals CDQ_W, X, Y, Z that are used to drive the multiplexer circuit 310 of FIG. 3 responsive to an order control signal CA_W, X, Y, Z and a delay compensation signal PLD.

In some embodiments, the order control signal CA_W, X, Y, Z encodes the timing between the respective pulse signals CDQ_W, X, Y, Z that are generated from the pulse train CDQ_1, 2, 3, 4 and are used as the clock signals that drive the multiplexer circuit 310 of FIG. 3. The ordering control signal generator 335 may generate the order control signal CA_W, X, Y, Z based on the logic table of FIG. 4. Using the same example discussed above in the Background of the Invention section, if the column address is 01 and the memory device is operating in sequential mode, then the output order for the data is D1, D2, D3, and D0. As shown in FIG. 4, the order control signal CA_W, X, Y, Z for CA0=1 and CA1=0 encodes CA_X first, CA_Y second, CA_Z third, and CA_W last. As a result, the control pulse multiplexer 333-1 outputs CDQ_1 as the clock or pulse signal CDQ_X, outputs CDQ_2 as the clock or pulse signal CDQ_Y, outputs CDQ_3 as the clock or pulse signal CDQ_Z, and outputs CDQ_4 as clock or pulse signal CDQ_W. As a result, the multiplexer circuit outputs the memory data in the order D1, D2, D3, and D0. Note that the memory device may also operate in interleave mode. In this case, the interleave mode section of the logic table of FIG. 4 would be used instead of the sequential section to generate the order control signal CA_W, X, Y, Z.

Figure 6:
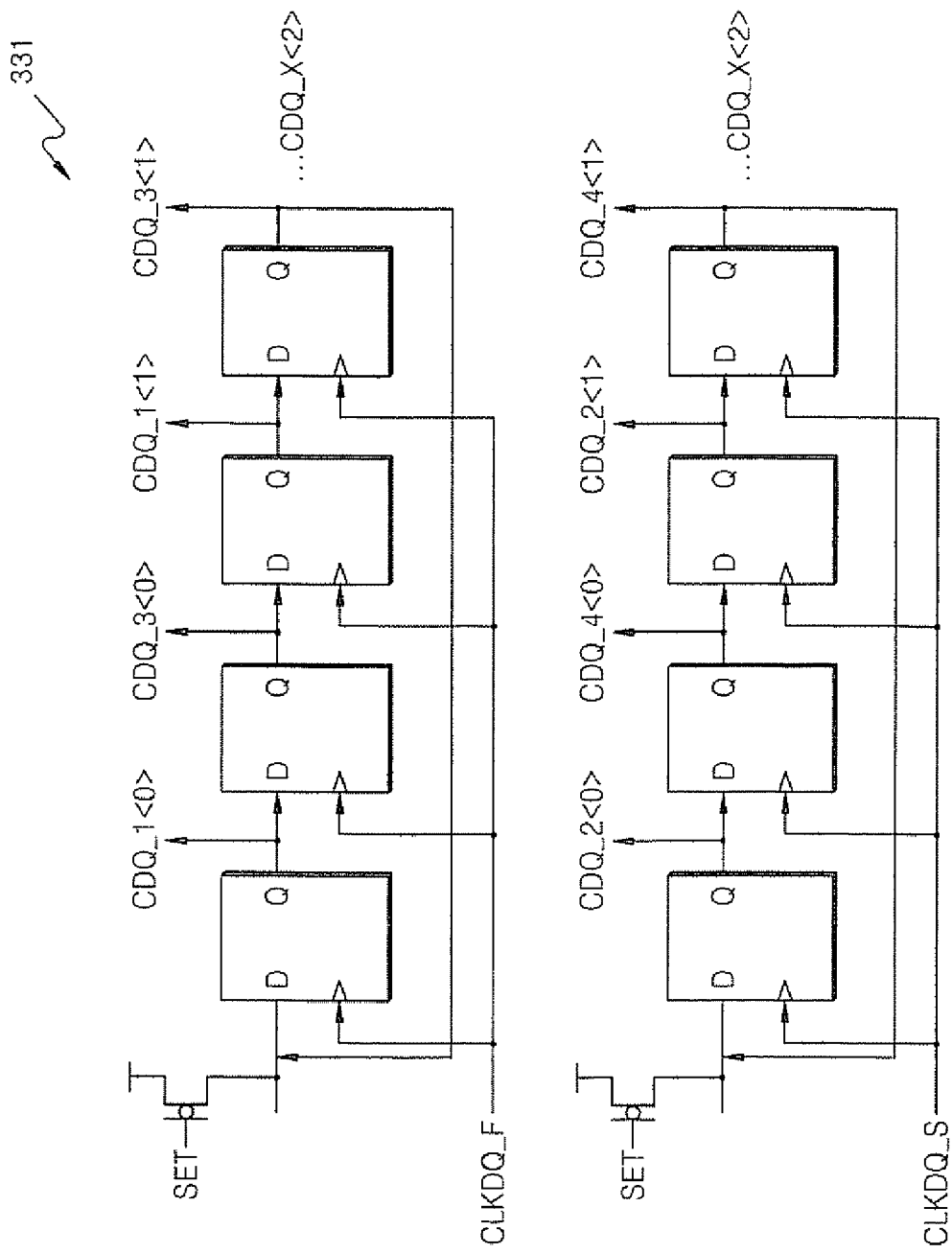
FIG. 6 is a circuit diagram of the reference pulse generator circuit of FIG. 5, in accordance with some embodiments of the present invention.

Referring to FIG. 6, according to some embodiments of the present invention, the reference pulse generator 331 comprises a plurality of D flip-flops connected in series. As shown in FIG. 6, one set of D flip-flops is responsive to a clock signal CLKDQ_F and a SET signal while another set of D flip-flops is responsive to a clock signal CLKDQ_S and a SET signal. The periodic pulse train CDQ_1, 2, 3, 4<0>, CDQ_1, 2, 3, 4<1>, ... is shown in FIG. 10.

Figure 7:
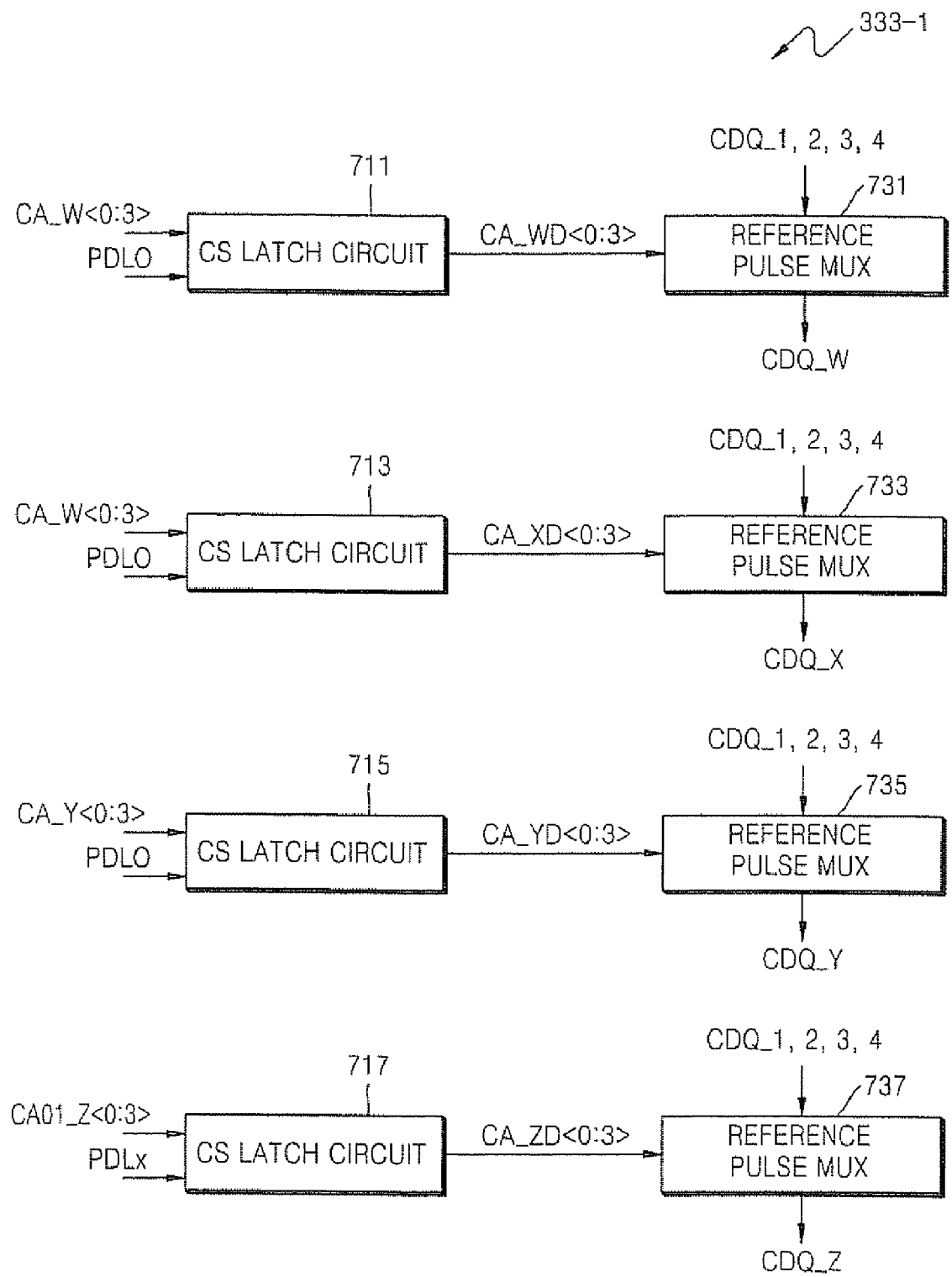
FIG. 7 is a block diagram of the control pulse multiplexer circuit of FIG. 5, in accordance with some embodiments of the present invention.

Referring to FIG. 7, the control pulse multiplexer 333-1, according to some embodiments of the present invention, is shown in more detail. The control pulse multiplexer 333-1 comprises a plurality of latch circuits 711, 713, 715, and 717 that are responsive to the order control signals CA_W, CA_X, CA_Y, and CA_Z, respectively, along with the delay compensation signal PDL0. As shown in FIG. 10, the delay compensation signal PDL0 is used to define the time period for outputting data D0 through D3 for a burst read operation by validating a sequence of order control signals CA_WD through CA_ZD, where the "D" denotes delay based on the delay compensation signal PDL0. The control pulse multiplexer 333-1 further comprises a plurality of reference pulse multiplexers 731, 733, 735, and 737 that are responsive to the order control signals CA_WD through CA_ZD, respectively. Each of the reference pulse multiplexers 731, 733, 735, and 737 outputs one of the pulse train signals CDQ_1, 2, 3, 4 as the clock or pulse signal CDQ_W, X, Y, Z, respectively, responsive to the order control signals CA_WD, XD, YD, ZD, respectively. The control pulse multiplexers 333-2 and 333-3 may be configured similarly to the control pulse multiplexer 333-1.

Figure 8:
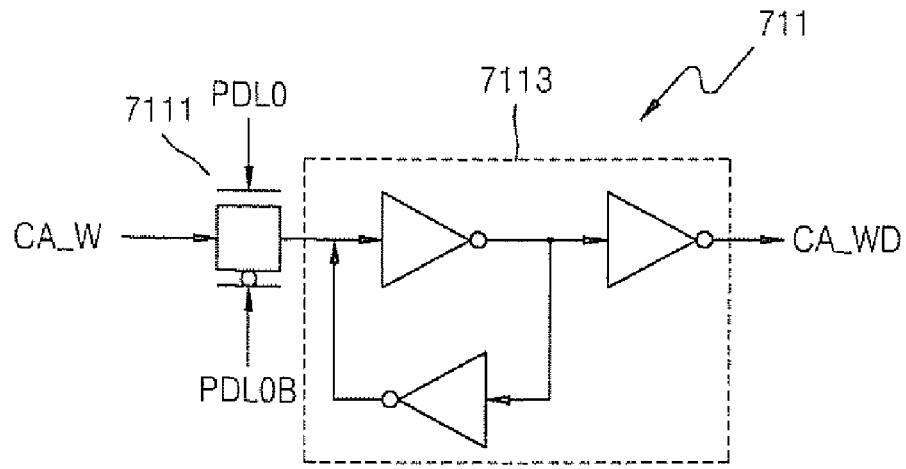
FIG. 8 is a circuit diagram of the latch circuit of FIG. 7, in accordance with some embodiments of the present invention.
Figure 9:
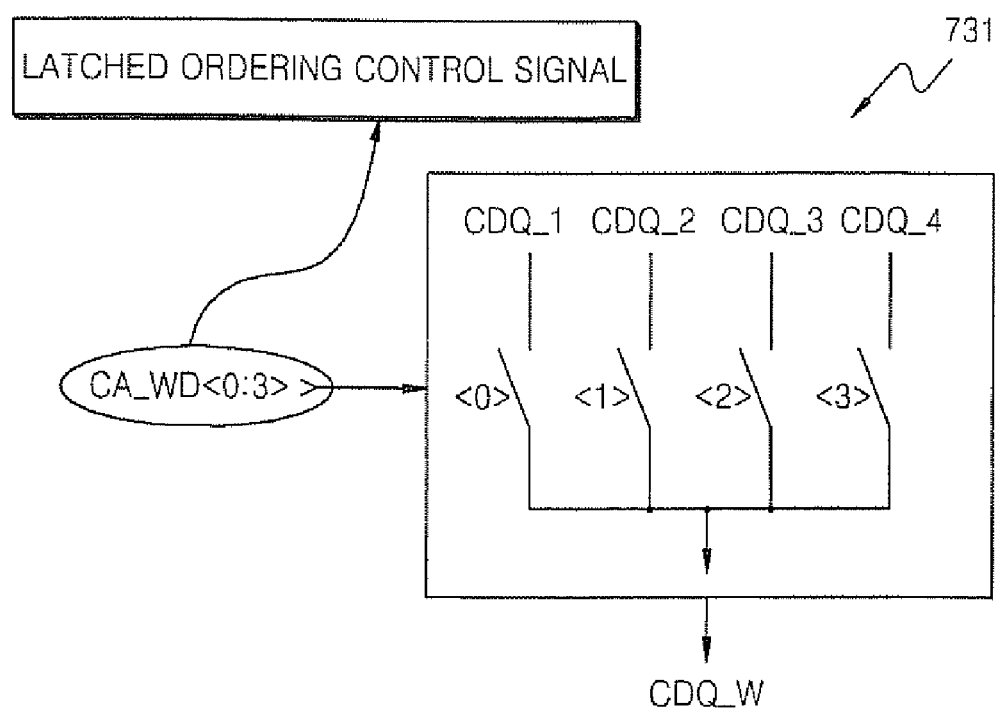
FIG. 9 is a circuit diagram of the reference pulse multiplexer circuit of FIG. 7, in accordance with some embodiments of the present invention.

Referring to FIG. 8, the latch circuit 711, according to some embodiments of the present invention, comprises a transmission gate 7111 that is coupled to a latch 7113. The transmission gate 7111 is activated responsive to the delay compensation signal PDL0. The latch circuits 713, 715, and 717 may be configured similarly to the latch circuit 711. Referring to FIG. 9, the reference pulse multiplexer 7311 according to some embodiments of the present invention, comprises a multiplexer circuit that is responsive to the order control signal CA_WD. The reference pulse multiplexers 733, 735, and 737 may be configured similarly to the reference pulse multiplexer 731.

Figure 10:
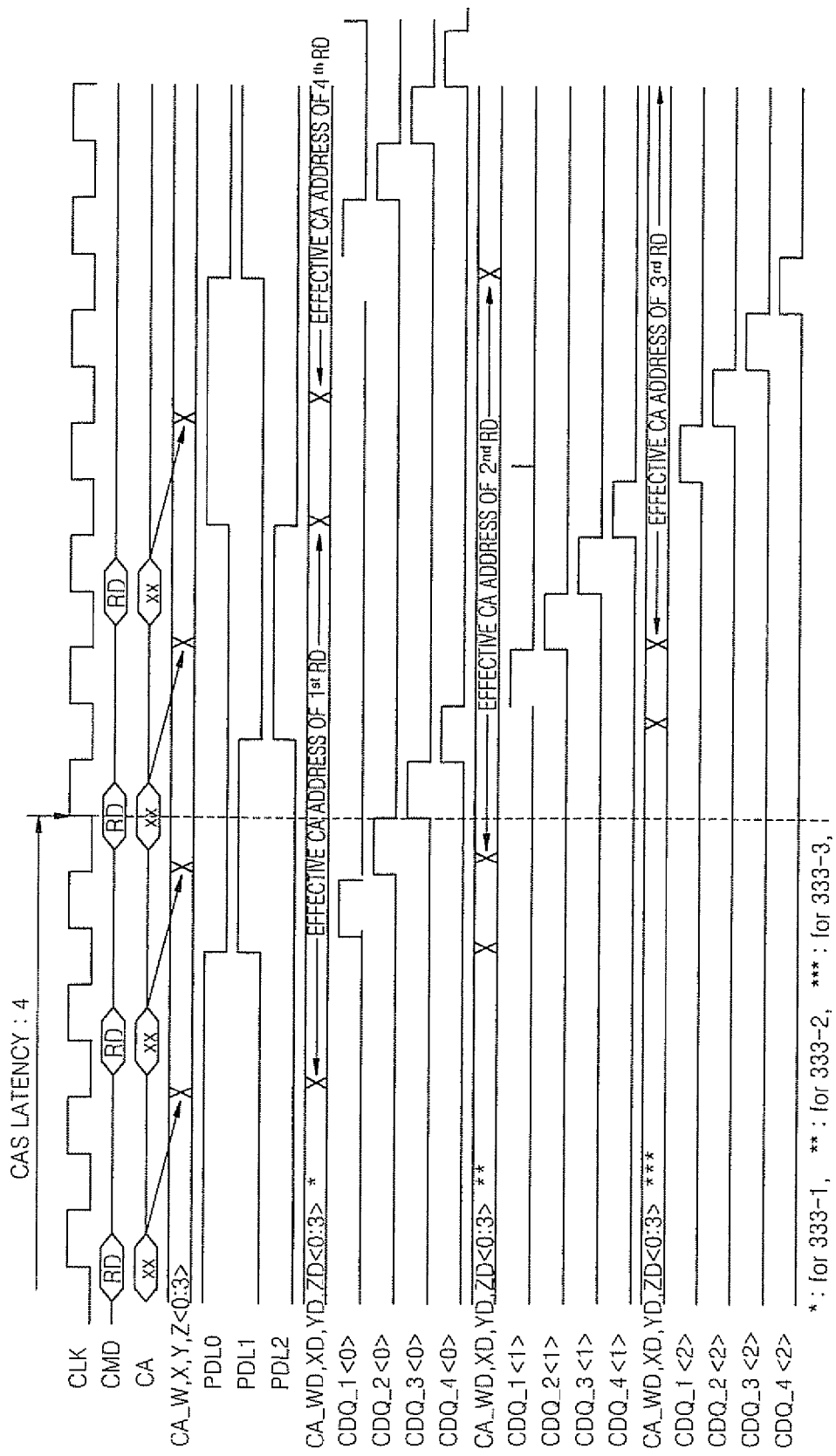
FIGS. 10-12 are timing diagrams that illustrate operations of data output circuits for an integrated circuit memory device, in accordance with some embodiments of the present invention.

FIG. 10 is a timing diagram that illustrates operations of data output circuits in accordance with some embodiments of the present invention. A first read command RD is issued at a column address CA on a rising edge of a first clock CLK pulse. The delay compensation signal PDL0 is driven high for this read operation while the other two delay compensation signals PDL1 and PDL2 remain low so as to use the order control signals CA_W, X, Y, Z to select the pulse train signals CDQ_1<0>, 2<0>, 3<0>, and 4<0> in a particular order to generate the clock or pulse signals CDQ_W<0>, X<0>, Y<0>, and Z<0> in the desired order. Because the CAS latency is four, the first set of data is output beginning at the fourth clock pulse. Similarly, a second read command RD is issued and the delay compensation signal PDL1 is driven high for this second read operation while the other two delay compensation signals PDL0 and PDL2 remain low. The order control signals CA_W, X, Y, Z are used to select the pulse train signals CDQ_1<1>, 2<1>, 3<1>, and 4<1> in a particular order to generate the clock or pulse signals CDQ_W<1>, X<1>, Y<1>, and Z<1> in the desired order. A third read command RD is issued and the delay compensation signal PDL2 is driven high for this third read operation while the other two delay compensation signals PDL0 and PDL1 remain low. The order control signals CA_W, X, Y, Z are used to select the pulse train signals CDQ_1 <2>, 2<2>, 3<2>, and 4<2> in a particular order to generate the clock or pulse signals CDQ_W<2>, X<2>, Y<2>, and Z<2> in the desired order.

Figure 11:
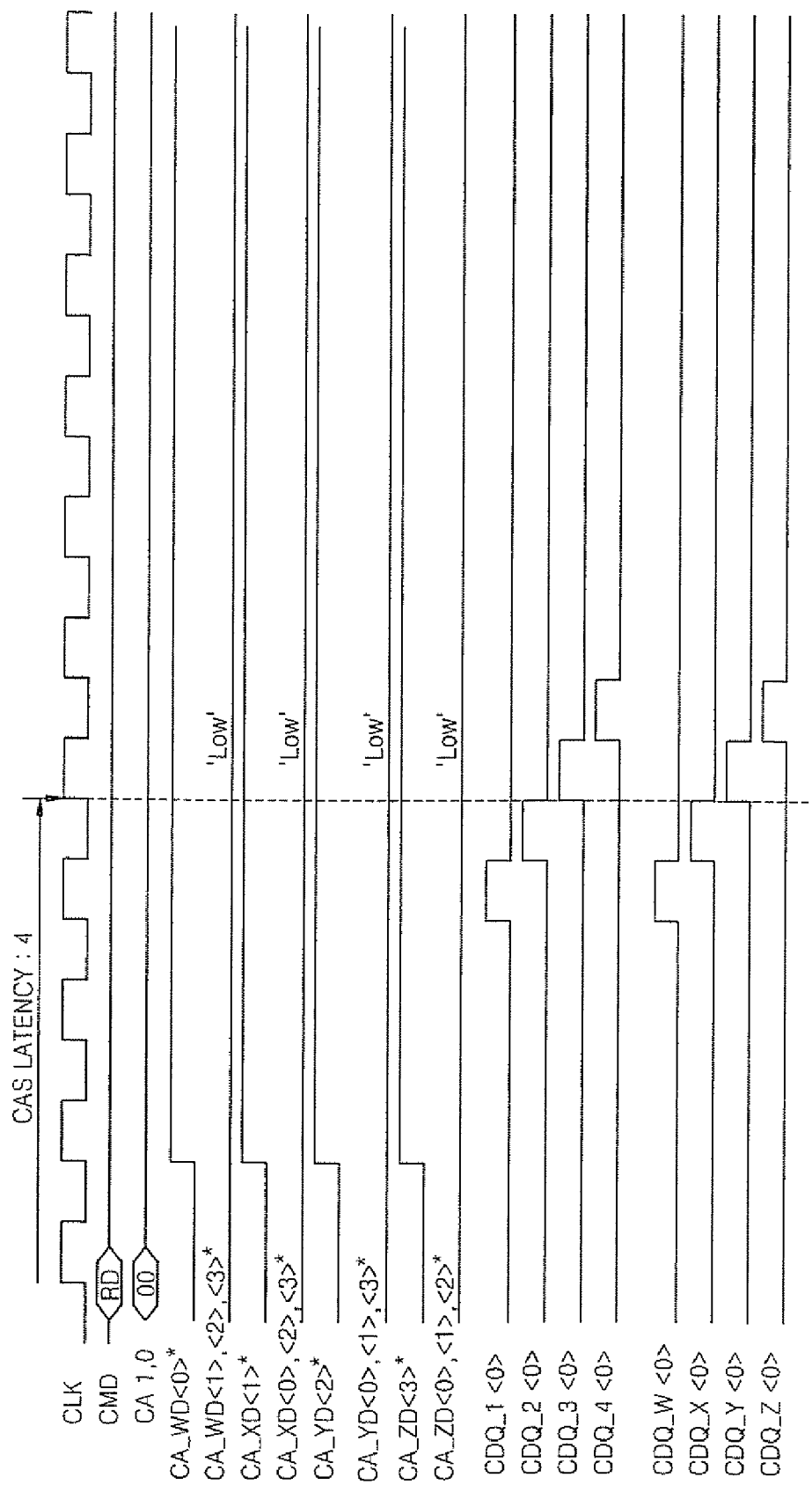

Some embodiments of the present invention may be illustrated by way of example. FIG. 11 is a timing diagram that illustrates the output of memory data beginning at a column address CA of 00. As shown in FIG. 11, the order control signal CA_W, X, Y, Z for CA0=0 and CA1=0 encodes CA_W first, CA_X second, CA_Y third, and CA_Z last based on the logic table of FIG. 4. As a result, CDQ_1 <0>, 2<0>, 3<0>, and 4<0> are selected as the clock or pulse signals CDQ_W<0>, X<0>, Y<0>, and Z<0> respectively and the memory data are output in the order D0, D1, D2, and D3.

Figure 12:
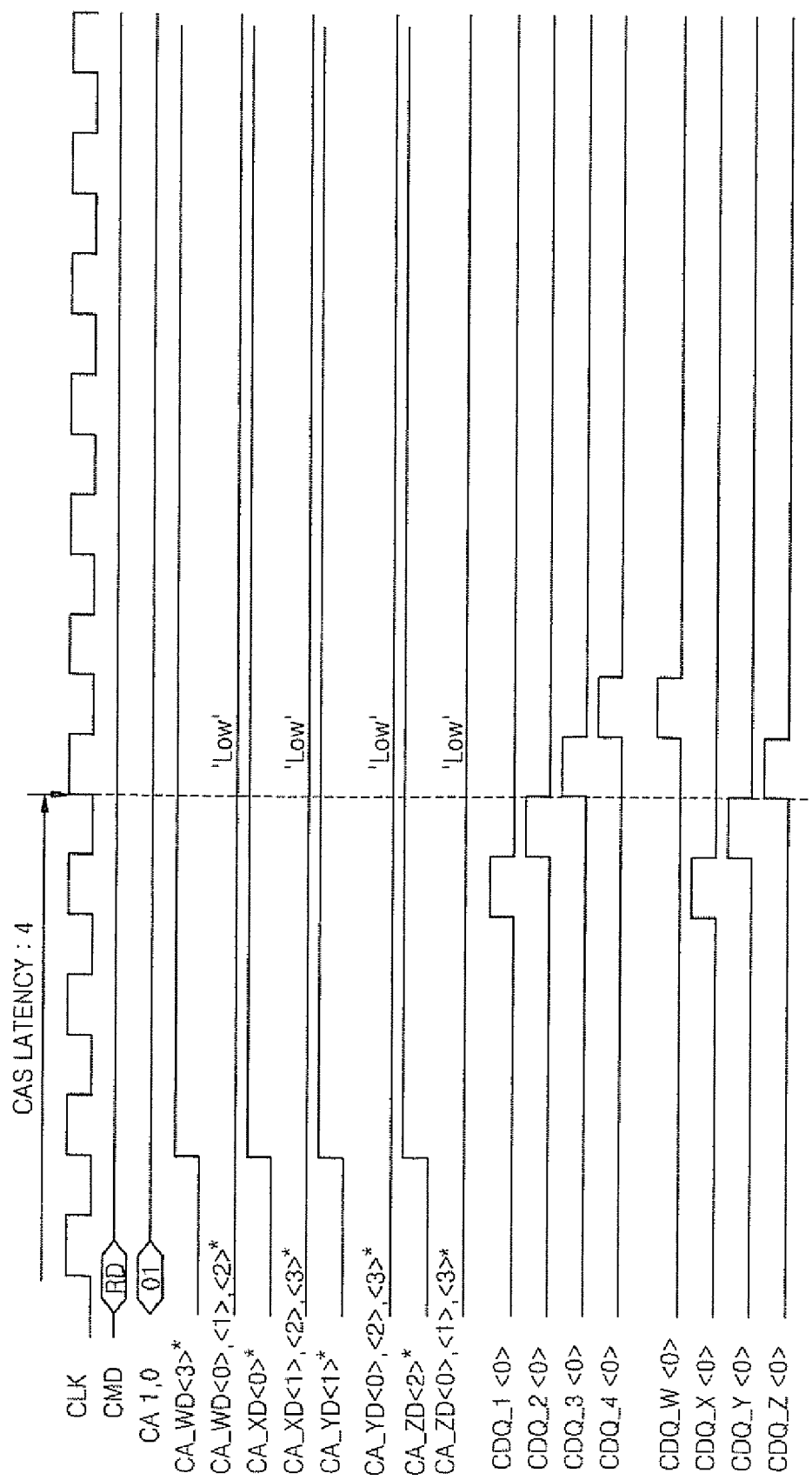

FIG. 12 is a timing diagram that illustrates the output of memory data beginning at a column address CA of 01. As shown in FIG. 12, the order control signal CA_W, X, Y, Z for CA0=1 and CA1=0 encodes CA_X first, CA_Y second, CA_Z third, and CA_W last based on the logic table of FIG. 4. As a result, CDQ_4<0>, 1<0>, 2<0>, and 3<0> are selected as the clock or pulse signals CDQ_W<0>, X<0>, Y<0>, and Z<0> respectively and the memory data are output in the order D1, D2, D3, and D0.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A data output circuit for an integrated circuit memory device, comprising:
    a control circuit that is configured to generate a plurality of clock signals responsive to at least a portion of a memory column address; and
    a multiplexer circuit that is configured to output memory data received on input terminals thereof onto an output terminal responsive to selective invocation of the plurality of clock signals, the plurality of clock signals being invoked in an order based on the at least a portion of the memory column address.

2. The data output circuit of claim 1, wherein the memory data comprise N memory data units, and wherein the control circuit comprises:
    an order control signal generator that is configured to generate an order control signal responsive to the at least a portion of a memory column address, the order control signal encoding an output order for the N respective memory data units.

3. The data output circuit of claim 2, wherein the control circuit further comprises:
    a reference pulse generator that is configured to generate a periodic pulse train; and
    a pulse multiplexer circuit that is configured to output N pulse signals from the periodic pulse train that are respectively associated with the N data units responsive to the order control signal such that a timing between the respective pulse signals is based on the output order encoded in the order control signal.

4. The data output circuit of claim 3, wherein the plurality of clock signals comprises the N pulse signals.

5. The data output circuit of claim 3, wherein the control circuit further comprises:
    a latch circuit that is configured to delay the order control signal responsive to a delay compensation signal.

6. The data output circuit of claim 5, wherein the delay compensation signal defines a time period for outputting the N memory data units.

7. The data output circuit of claim 3, wherein the reference pulse generator comprises a plurality of flip-flop circuits connected in series.

8. The data output circuit of claim 2, wherein the memory data units are bits.

9. The data output circuit of claim 2, wherein the memory data units are bytes.

10. The data output circuit of claim 1, wherein the integrated circuit memory device is a DRAM memory device.

11. The data output circuit of claim 1, wherein the multiplexer circuit is configured to output the memory data in an interleaved order.

12. The data output circuit of claim 1, wherein he multiplexer circuit is configured to output the memory data in a sequential order.

13. A method of operating an integrated circuit memory device that includes a data output circuit, comprising:
   generating a plurality of clock signals responsive to at least a portion of a memory column address; and
   multiplexing memory data onto an output terminal of the data output circuit responsive to selective invocation of the plurality of clock signals, the clock signals being invoked in an order based on the at least a portion of the memory column address.

14. The method of claim 13, wherein the memory data comprise N memory data units and wherein generating the plurality of clock signals comprises:
   generating an order control signal that encodes an output order for the N respective memory data units responsive to the at least a portion of a memory column address.

15. The method of claim 14, wherein generating the plurality of clock signals further comprises:
   generating a periodic pulse train; and
   selecting N pulse signals from the periodic pulse train that are respectively associated with the N data units responsive to the order control signal such that a timing between the respective pulse signals is based on the output order encoded in the order control signal.

16. The method of claim 15, wherein the plurality of clock signals comprises the N pulse signals.

17. The method of claim 15, wherein generating the plurality of clock signals further comprises:
   delaying the order control signal responsive to a delay compensation signal.

18. The method of claim 17, wherein the delay compensation signal defines a time period for outputting the N memory data units onto the output terminal.

19. The method of claim 14, wherein the memory data units are bits.

20. The method of claim 14, wherein the memory data units are bytes.

21. The method of claim 13, wherein multiplexing the memory data comprises multiplexing memory data onto the output terminal of the data output circuit in an interleaved order.

22. The method of claim 13, wherein multiplexing the memory data comprises multiplexing memory data onto the output terminal of the data output circuit in a sequential order.

23. A memory device, comprising:
   a memory core that is configured to store data therein;
   a control circuit that is configured to generate a plurality of clock signals responsive to at least a portion of a memory core column address; and
   a multiplexer circuit that is configured to output the memory core data received on input terminals thereof onto an output terminal responsive to selective invocation of the plurality of clock signals, the plurality of clock signals being invoked in an order based on the at least a portion of the memory column address.

24. The memory device of claim 23, wherein the memory core data comprise N memory core data units, and wherein the control circuit comprises:
   an order control signal generator that is configured to generate an order control signal responsive to the at least a portion of a memory core column address, the order control signal encoding an output order for the N respective memory core data units.

25. The memory device of claim 24, wherein the control circuit further comprises:
   a reference pulse generator that is configured to generate a periodic pulse train; and
   a pulse multiplexer circuit that is configured to output N pulse signals from the periodic pulse train that are respectively associated with the N data units responsive to the order control signal such that a timing between the respective pulse signals is based on the output order encoded in the order control signal.

26. The memory device of claim 23, wherein the memory device is a DRAM memory device.

27. The memory device of claim 23, wherein the multiplexer circuit is configured to output the memory core data in an interleaved order.

28. The memory device of claim 23, wherein the multiplexer circuit is configured to output the memory core data in a sequential order.

* * * * *